United States Patent
Salvetti (10) Patent No.: US 10,066,988 B2
(45) Date of Patent: Sep. 4, 2018

(54) DETECTION DEVICE HAVING A PHOTODETECTOR CONNECTED TO A TERMINAL OF AN AMPLIFIER SO AS TO REVERSE BIAS THE PHOTODETECTOR

(71) Applicant: SOCIÉTÉ FRANÇAISE DE DÉTECTEURS INFRAROUGES—SOFRADIR, Palaiseau (FR)

(72) Inventor: Frédéric Salvetti, Montbonnot (FR)

(73) Assignee: SOCIÉTÉ FRANÇAISE DE DÉTECTEURS INFRAROUGES—SOFRADII, Palaiseau (FR)

( * ) Notice: Subject to any disclaimer, the term of this patent is extended or adjusted under 35 U.S.C. 154(b) by 35 days.

(21) Appl. No.: 15/041,496

(22) Filed: Feb. 11, 2016

(65) Prior Publication Data

US 2016/0238446 A1  Aug. 18, 2016

(30) Foreign Application Priority Data

Feb. 12, 2015 (FR) ..................... 15 51132

(51) Int. Cl.
| | |
|---|---|
| *H03F 3/72* | (2006.01) |
| *G01J 1/46* | (2006.01) |
| *H04N 5/3745* | (2011.01) |
| *H04N 5/232* | (2006.01) |
| *H04N 5/378* | (2011.01) |

(Continued)

(52) U.S. Cl.
CPC ............. *G01J 1/46* (2013.01); *H03F 3/087* (2013.01); *H03F 3/45183* (2013.01); *H03F 3/45475* (2013.01); *H03F 3/72* (2013.01); *H04N 5/23241* (2013.01); *H04N 5/378* (2013.01); *H04N 5/3745* (2013.01); *H03F 2200/261* (2013.01); *H03F 2203/45396* (2013.01); *H03F 2203/45726* (2013.01)

(58) Field of Classification Search
CPC .......... G01J 1/46; G01J 2001/444; G01J 1/42; H03F 2200/372; H03F 3/72; H04B 10/697; H04N 5/23241
USPC ..................................................... 250/214 R
See application file for complete search history.

(56) References Cited

U.S. PATENT DOCUMENTS 4,889,985 A * 12/1989 Allsop ................. H04B 10/697
250/214 A
6,097,021 A 8/2000 Aswell et al.
(Continued)

FOREIGN PATENT DOCUMENTS

| EP | 0 845 687 A2 | 6/1998 |
|---|---|---|
| FR | 2 593 319 A1 | 7/1987 |

*Primary Examiner* — Que T Le
(74) *Attorney, Agent, or Firm* — Oliff PLC (57) ABSTRACT

The detection device comprises a photodetector configured to transform an electromagnetic signal into a representative electric signal. The detection device also comprises an amplifier having a first input terminal connected to a first terminal of the photodetector. An integration capacitor is connected to the output terminal of the amplifier and to the first input terminal of the amplifier. A first source of a reference voltage is connected to a second input terminal of the amplifier. A second source of a detector voltage is connected to a second input terminal of the photodetector. The first and second voltage sources are correlated so as to correlate the noise components.

10 Claims, 5 Drawing Sheets

(51) Int. Cl.
*H03F 3/08* (2006.01)
*H03F 3/45* (2006.01)

(56) References Cited

U.S. PATENT DOCUMENTS 7,773,134 B2 * 8/2010 Tan ..................... G01J 1/0252
　　　　　　　　　　　　　　　　　　　348/241
2014/0061488 A1　3/2014 Sato et al.

* cited by examiner

DETECTION DEVICE HAVING A PHOTODETECTOR CONNECTED TO A TERMINAL OF AN AMPLIFIER SO AS TO REVERSE BIAS THE PHOTODETECTOR

BACKGROUND OF THE INVENTION

The invention relates to an improved detection device.

STATE OF THE ART

In numerous activities, a scene is observed by a detection device which comprises a photodetector. The photodetector receives a luminous signal which it transforms into an electric signal representative of the observed scene.

Figure 1:
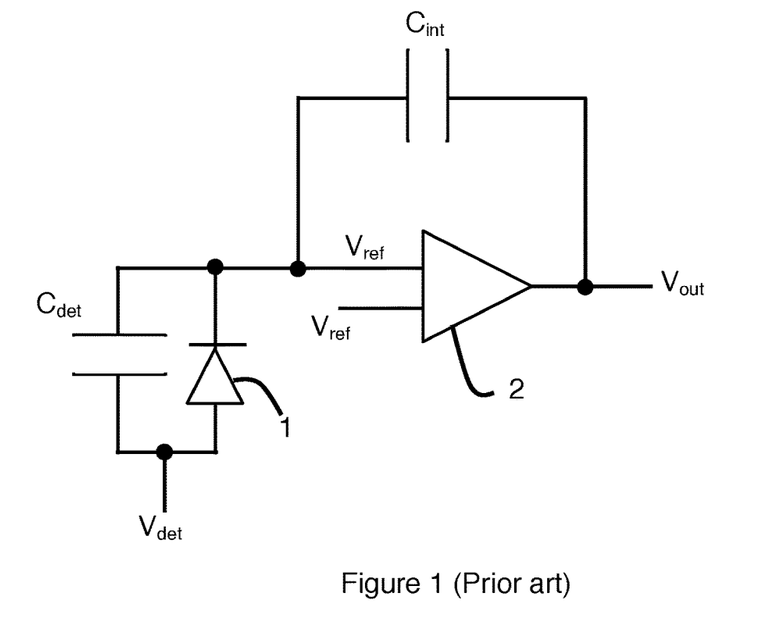
FIG. 1 represents a detector circuit of the prior art, in schematic manner.

In a conventional embodiment illustrated in FIG. 1, the photodetector 1 is a photodiode which comprises a stray capacitor $C_{det}$ connected in parallel with the photodetector 1.

The photodetector 1 is connected to a readout circuit of Capacitive TransImpedance Amplifier (CTIA) type.

The readout circuit comprises an amplifier 2 one input of which is connected to the photodetector 1. The other input of the amplifier 2 is connected to a voltage source which applies the voltage $V_{ref}$. The output of the amplifier 2 delivers a voltage signal $V_{out}$ representative of the current signal delivered by the photodetector 1.

An integration capacitor Cint is connected to the amplifier in negative feedback mode, i.e. it connects the output terminal and the terminal connected to the photodetector.

However, in this type of architecture, noise is observed on the output terminal which causes interference to the electric signal representative of the observed scene.

The signal-to-noise ratio is particularly unfavourable in detection devices which present photodetectors of large size and which are configured to detect a very weak flux, i.e. the integration capacitor presents a weak electric capacitance and a strong capacitance of the detector.

OBJECT OF THE INVENTION

The object of the invention is to provide a detection device which presents an improved signal-to-noise ratio.

This result tends to be achieved by means of a detection device comprising:
- a photodetector configured to transform an electromagnetic signal into a representative electric signal,
- an amplifier having a first input terminal connected to a first terminal of the photodetector,
- an integration capacitor connected to the output terminal of the amplifier and to the first input terminal of the amplifier,
- a first voltage source configured to deliver a reference voltage to a second input terminal of the amplifier,
- a second voltage source configured to deliver a detector voltage to a second terminal of the photodetector.

The detection device is remarkable in that the first and second voltage sources are correlated so as to correlate the noise components. In this manner, certain noise components are cancelled out.

It is particularly advantageous to provide for the amplifier to be unbalanced so that the voltage on the first input terminal of the amplifier is offset from the voltage on the second input terminal of the amplifier by a voltage difference at least equal to 20 mV. The fabrication imponderables thus have a negligible effect on conversion of the luminous signal into an electric signal. Preferably the voltage difference is comprised between 50 and 100 mV to even further reduce the effects of the fabrication method on a very large number of photodetectors and of readout circuits.

It is also interesting to provide for the amplifier to comprise a current mirror provided with two shunt-connected branches, one of the branches presenting different electric performances from the other branch. It is thus easily possible to achieve an unbalanced amplifier.

In a particular case, one of the branches of the current mirror comprises several additional transistors connected in parallel with a main transistor, the additional transistors and the main transistor all receiving the same signal on their control electrode. In a more precise embodiment, one of the branches of the current mirror comprises several connecting switches connected to enable or disable the flow of a current from each associated additional transistor.

In another particular case, the first and second input terminals are respectively connected to control electrodes of first and second transistors and the first and second transistors present different electric performances.

In a more precise embodiment, it is possible to provide for the first and second input terminals to be respectively connected to control electrodes of first and second transistors and for several additional transistors to be connected in parallel with the first transistor, the additional transistors receiving the same signal as the first transistor on their control electrodes.

It is further possible to provide for the additional transistors to be connected in parallel by means of several connecting switches connected to enable or disable the flow of a current from each associated additional transistor.

In a particular embodiment, the first voltage source is the second voltage source so that the reference voltage is equal to the detector voltage.

In another particular embodiment, the first voltage source and the second voltage source are formed by means of an initial voltage source supplying a resistive bridge delivering the reference voltage and the detector voltage different from the reference voltage.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 2:
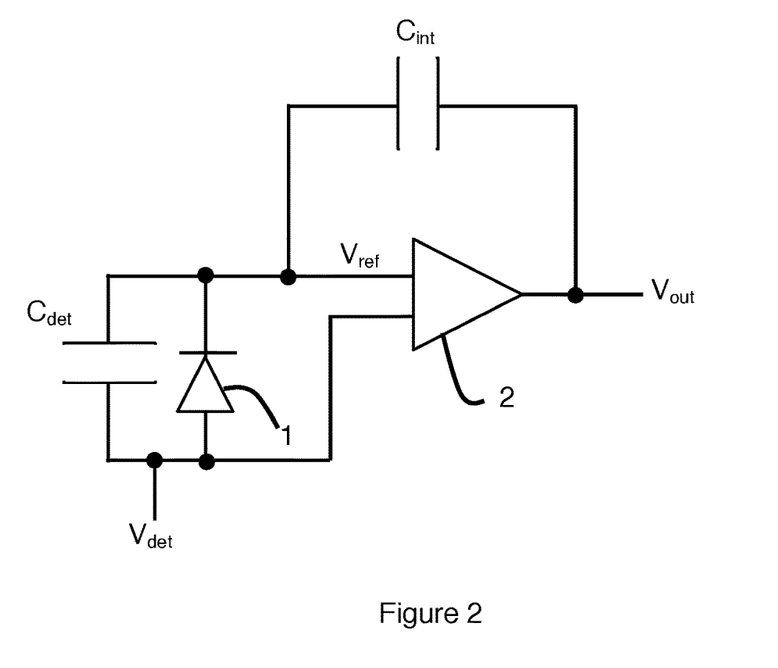
FIG. 2 represents a first embodiment of a detection circuit, in schematic manner.

FIG. 2 illustrates a first embodiment of a detection circuit.
The detection circuit comprises a photodetector 1 which is preferentially a photodiode. The photodetector comprises a stray capacitor $C_{det}$ connected in parallel with the photodetector 1. The photodetector generates a current representative of the observed scene. The photodetector can be configured to detect signals in the visible range or in the infrared range.

The photodetector 1 is connected to a readout circuit of Capacitive TransImpedance Amplifier (CTIA) type.

The readout circuit comprises an amplifier 2 an input of which is connected to the photodetector 1. The other input of the amplifier 2 is connected to a voltage source which applies the voltage $V_{ref}$. The output of the amplifier 2 delivers a voltage signal $V_{out}$ representative of the current signal delivered by the photodetector 1.

An integration capacitor $C_{int}$ is connected to the amplifier in negative feedback mode, i.e. it connects the output terminal and the first input terminal connected to the photodetector 1.

In such a configuration, a component of the noise present on the output terminal delivering the voltage $V_{out}$ can be written:

$$\text{noise} = \left(1 + \frac{C_{det}}{C_{int}}\right) \cdot V_{ref*} - \frac{C_{det}}{C_{int}} \cdot V_{det*}$$

To reduce the noise component, it can be observed that it is advantageous to have equality between the noises of the voltages $V_{ref*}$ and $V_{det*}$ and to provide the two voltages by means of the same voltage source so that the noise components are correlated and cancel each other out. $V_{ref*}$ and $V_{det*}$ represent the noise components of the voltages $V_{ref}$ and $V_{det}$. In this way, the noise generated on output of the readout circuit by the reference voltages which are the voltages $V_{ref}$ and $V_{det}$ is cancelled out. It can also be observed that the noise level is linked to the ratio of the capacitors $$\frac{C_{det}}{C_{int}}.$$

However, the electric capacitance values are linked to the performances of the device and are not easily modifiable.

In the particular embodiment illustrated in FIG. 2, the voltage $V_{ref}$ and voltage $V_{det}$ are identical and are provided by the same voltage source so that the noise component provided by the voltage source is correlated for the voltage $V_{ref}$ applied on a terminal of the amplifier and for the voltage $V_{det}$ applied on a terminal of the photodetector. In the illustrated example, the voltage $V_{det}$ is applied on the photodetector and on the amplifier. In other words, the first voltage source is the second voltage source so that the reference voltage $V_{ref}$ is equal to the detector voltage $V_{det}$.

Tests have shown that in this embodiment, the noise component is cancelled out which improves the signal-to-noise ratio.

Although this embodiment gives good results, it is been observed that in a matrix of photodetectors associated with a matrix of readout circuits, the fabrication imponderables of the readout circuits lead to differences of bias applied by the amplifier 2 on the terminal of the photodetector 1. In certain cases, the photodetector 1 is reverse biased, in other cases the photodetector 1 is forward biased and cases also exist where the same bias is applied to the two terminals of the photodetector 1.

These bias variations result in a difference of behaviour of the photodetector 1 when the luminous signal is transformed into an electric signal which cancels out a part of the gain procured by the use of the same voltage source on the noise level.

In a particular embodiment, the operational amplifier 2 is unbalanced so as to create a voltage difference between the inverting input and the non-inverting input, i.e. between the two inputs of the amplifier.

Theoretically, the voltages present on the two inputs of the operational amplifier are identical. For example, when the voltage $V_{ref}$ is applied on the second input terminal of the amplifier 2 and if the capacitor $C_{int}$ is discharged or weakly charged, the first input terminal of the amplifier is also at the voltage $V_{ref}$ which enables the photodetector 1 to be biased. Such an embodiment is illustrated in FIG. 1.

In practice, when several operational amplifiers are fabricated, a slight voltage difference exists between the different amplifiers and the value of this difference varies from one amplifier to another. In conventional manner, the voltage difference between the two inputs (also called inverting and non-inverting inputs) is less than 10 mV in absolute value. In a detection device which comprises a matrix of photodetectors (for example 1000 photodetectors) associated with a matrix of readout circuits (for example 1000 readout circuits), multiple different bias voltages are observed.

In order to ensure a more homogeneous operation of the photodetectors, it is advantageous to unbalance the operational amplifier 2 so that the difference between the inverting and non-inverting inputs is greater than or equal to 20 mV and preferably in the 50-100 mV range. In other words, the amplifier is unbalanced so that the voltage on the first input terminal of the amplifier is offset from the voltage on the second input terminal of the amplifier by a voltage difference at least equal to 20 mV and preferably in the 50-100 mV range. In preferential manner, the unbalance is achieved so that the voltage offset is between three and six times the dispersion observed on the transistors.

Under these conditions, the fabrication variations of the different amplifiers do not disturb the bias conditions of the photodetector 1. In particularly advantageous manner, the operational amplifier 2 is unbalanced so that the photodetector 1 is reverse biased. In the case where the photodetector 1 is a photodiode, this precaution enables the photodiode to be placed on the reverse bias plateau. If a matrix of photodetectors 1 is used in association with a matrix of readout circuits, the variations of behaviour linked to the bias variation are at least partially eliminated.

In this case, although the voltage $V_{det}$ is applied on the second input terminal of the amplifier 2, the first input terminal delivers the voltage $V_{ref}$.

Numerous methods of proceeding exist to unbalance an amplifier. A simple way is to unbalance the two branches connected to the two inputs of the amplifier. In a large number of embodiments, the two branches are shunt-connected. It is then interesting to present two branches which comprise different electric performances.

The amplifier commonly comprising a current mirror provided with two shunt-connected branches, it is then possible to provide for one of the branches to present different electric performances from the other branch.

In another embodiment, the first and second input terminals are respectively connected to the control electrodes of first and second transistors T3 and T4. The unbalance is introduced by using first and second transistors which present different electric performances.

Figure 3:
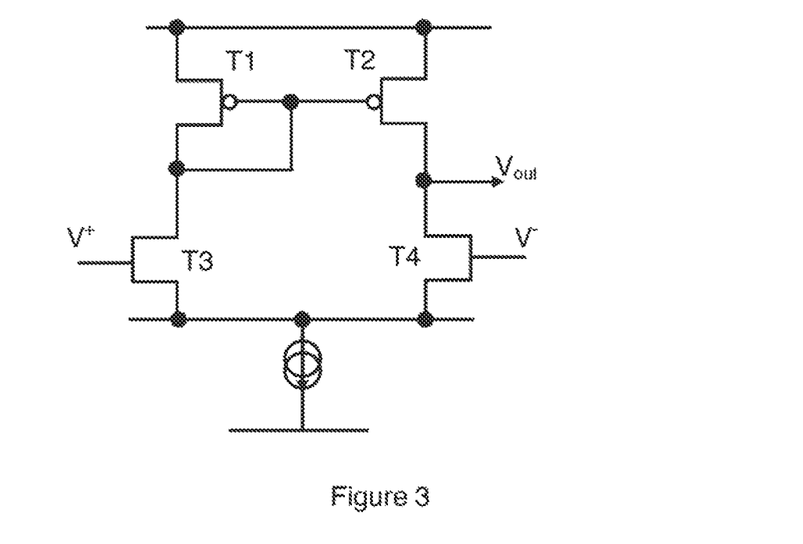
FIG. 3 represents a first embodiment of an operational amplifier of a detection circuit, in schematic manner.

FIG. 3 illustrates a schematic embodiment of an operational amplifier. The operational amplifier comprises a current mirror circuit formed by the transistors T1 and T2. The inverting and non-inverting inputs are represented by the control electrodes receiving the signals V⁻ and V⁺. The signal V⁺ is applied on the control electrode of transistor T3. The signal V⁻ is applied on the control electrode of transistor T4.

Transistors T1 and T3 are connected in series in a first branch whereas transistors T2 and T4 are connected in series in a second branch. The two branches are shunt-connected.

To achieve a voltage difference between the inverting and non-inverting inputs, it is possible to unbalance the operational amplifier by means of transistors having different electric performances. Whereas in a conventional operational amplifier, identical transistors are used for the inverting and non-inverting inputs, in this embodiment the transistors are different between the two inputs. One way of fabricating such a device is for example to use transistors having different sizes. The transistors T1 and T3 receiving the signals V⁺ and V⁻, i.e. for example the voltage $V_{det}$, have different dimensions. It is also possible to have transistors T1 and T2 having different dimensions. It is further possible to have a combination of these two embodiments, so long as the two shunt-connected branches present different electric performances.

Figure 4:
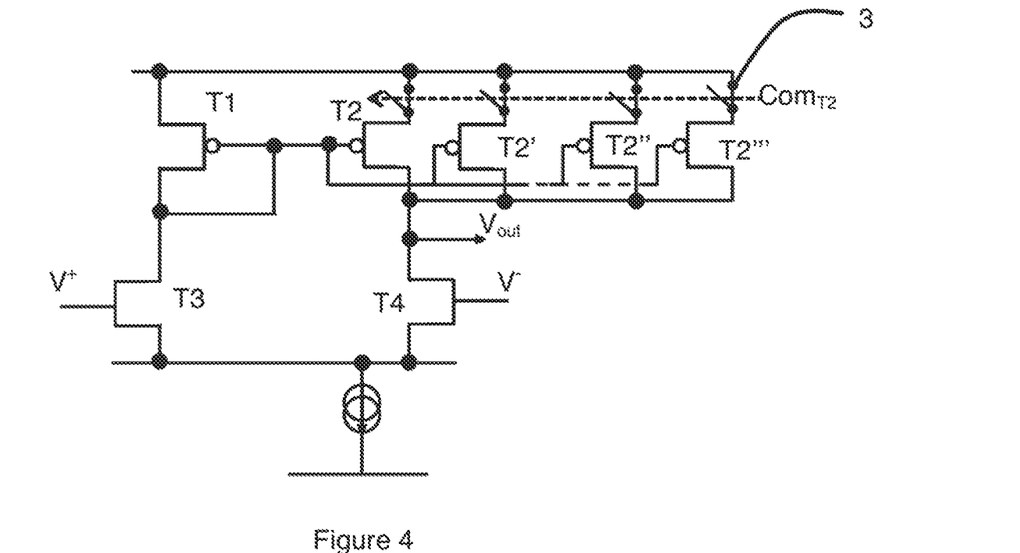
FIGS. 4 and 5 represent embodiments of an operational amplifier with unbalanced current mirror, in schematic manner.
Figure 5:
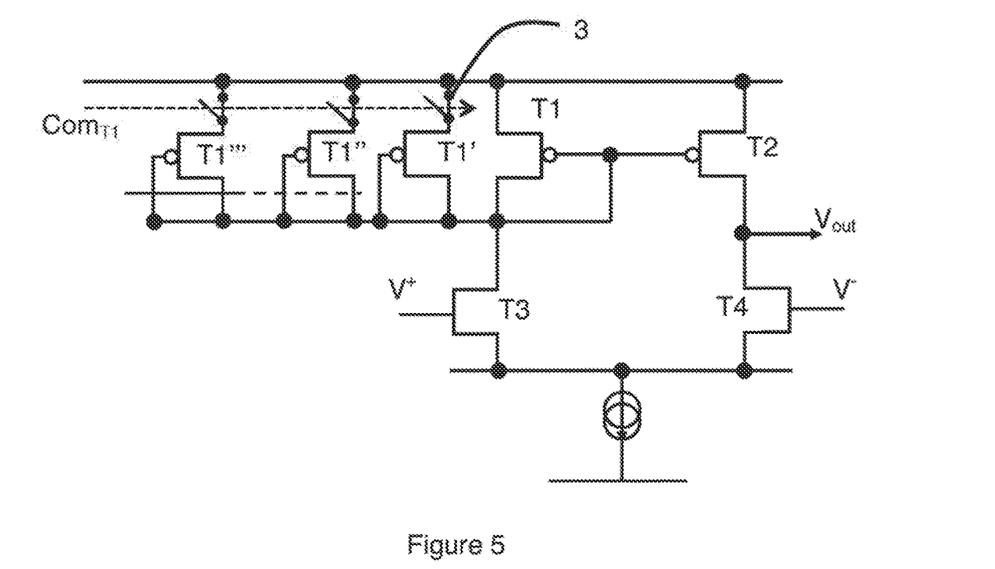

FIGS. 4 and 5 illustrate two embodiments in which the operational amplifier is unbalanced by means of unbalanced current mirrors. In these cases, one of the branches of the current mirror comprises several additional transistors connected in parallel to a main transistor, the additional transistors and the main transistor all receiving the same signal on their control electrode. In more precise manner, it is possible to provide for the branch equipped with the additional transistors to comprise several connecting switches 3 connected to enable or disable the flow of a current from each associated additional transistor.

In the embodiment of FIG. 4, several additional transistors T2', T2" and T2''' are connected in parallel to the main transistor T2. The transistors all receive the same signal on their control electrode. In this embodiment, the different additional transistors are each coupled to a connecting switch 3 which is configured to enable or disable the flow of a current to the branch containing the transistor T2. These different connecting switches 3 are activated separately by the signal $Com_{T2}$. The $Com_{T2}$ signal makes it possible to choose whether one or more transistors have to be connected in parallel to transistor T2. In this way, it is possible to choose the quantity of current which will flow in the branch of the current mirror. The larger the number of connected transistors, the greater the current delivered. By modulating the number of parallel-connected transistors, it is possible to modulate the unbalance between the two branches of the current mirror.

By choosing a transistor T1 larger than transistor T2, it is possible to have an unbalance in a first direction between the two branches of the current mirror and to then eliminate the unbalance or reverse the unbalance by increasing the number of transistors connected in parallel with transistor T2.

In advantageous manner, transistors T1, T2, T2', T2" and T2''' are identical so as to facilitate the manufacturing process. The number of series-connected transistors defines the amplitude of the unbalance.

In the embodiment of FIG. 5, the unbalance is made on the other branch of the current mirror. Several transistors are connected in parallel to the main transistor T1. The different additional transistors T1', T1" and T1''' are coupled to connecting switches 3 which are activated by the signal $Com_{T1}$. What was explained for the embodiment of FIG. 4 also applies to the embodiment of FIG. 5 with inversion of the transistors T1 and T2.

It is also possible to combine these two embodiments.

Figure 6:
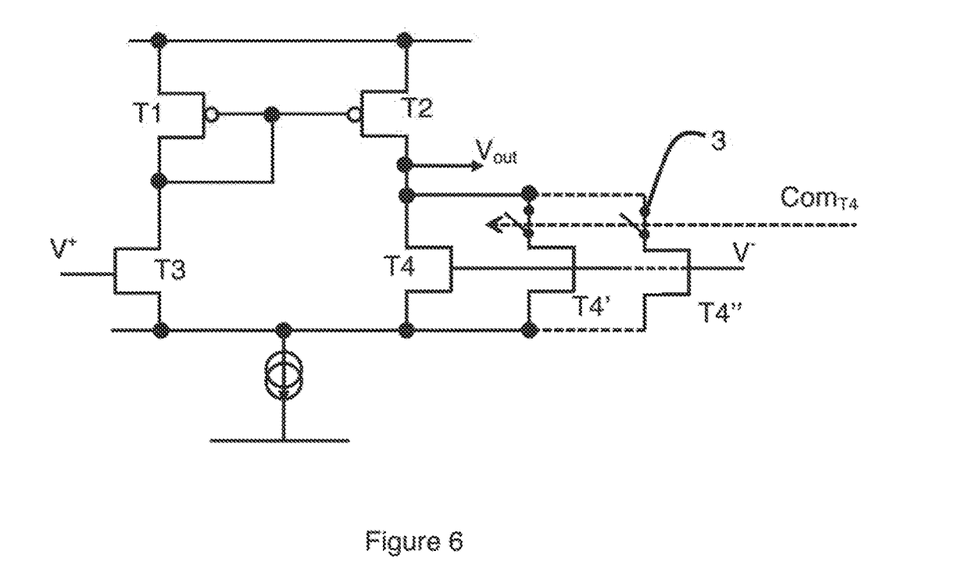
FIGS. 6 and 7 represent embodiments of an operational amplifier with unbalance of the branches receiving the input signals, in schematic manner.
Figure 7:
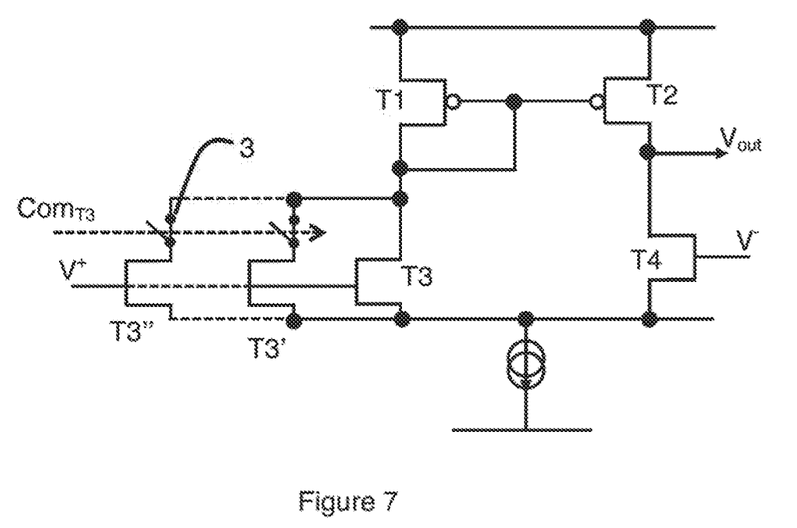

In an alternative embodiment, the unbalance is made on the transistors receiving the signals V⁺ and V⁻. The embodiments of FIGS. 6 and 7 represent connection set-ups wherein the operational amplifier can be easily unbalanced. In these embodiments, the first and second input terminals are respectively connected to the control electrodes of first and second transistors and several additional transistors are connected in parallel to the first transistor, the additional transistors receiving on their control electrodes the same signal as the first transistor which can be transistor T3 or T4. In more precise manner, it is advantageous to provide for the additional transistors to be connected in parallel by means of several connecting switches 3 connected to enable or disable the flow of a current from each associated additional transistor.

In the embodiment of FIG. 6, several transistors are connected in parallel with transistor T4 so as to increase the quantity of current flowing in the branch containing transistor T4. As for the previous embodiments, all the parallel-connected transistors receive the same signal on their control electrode, here the signal V⁻. All the additional transistors are also coupled to a connecting switch 3 which is configured to enable or to disable the flow of an additional current in the branch of the operational amplifier. The connecting switches 3 are activated by means of the signal $Com_{T4}$. As for the previous embodiments, the signal $Com_{T4}$ enables the number of parallel-connected transistors, and therefore the current difference between the two branches, to be defined.

The embodiment of FIG. 7 illustrates another embodiment where the unbalance of the amplifier is achieved by means of several transistors connected in parallel with transistor T3. As for the previous embodiment, the multiple parallel-connected transistors enable the quantity of current flowing in this branch, and therefore the current difference between the two branches, to be modulated. The number of transistors involved in transfer of the current is defined by means of the connecting switches 3 and therefore by means of the signal $Com_{T3}$ which activates the connecting switches 3.

The embodiments of FIGS. 6 and 7 can be combined. It is also possible to combine the embodiments illustrated in FIGS. 4, 5, 6 and 7 indifferently.

These different embodiments are particularly advantageous as they enable a device that is compact and easily producible to be kept.

Figure 8:
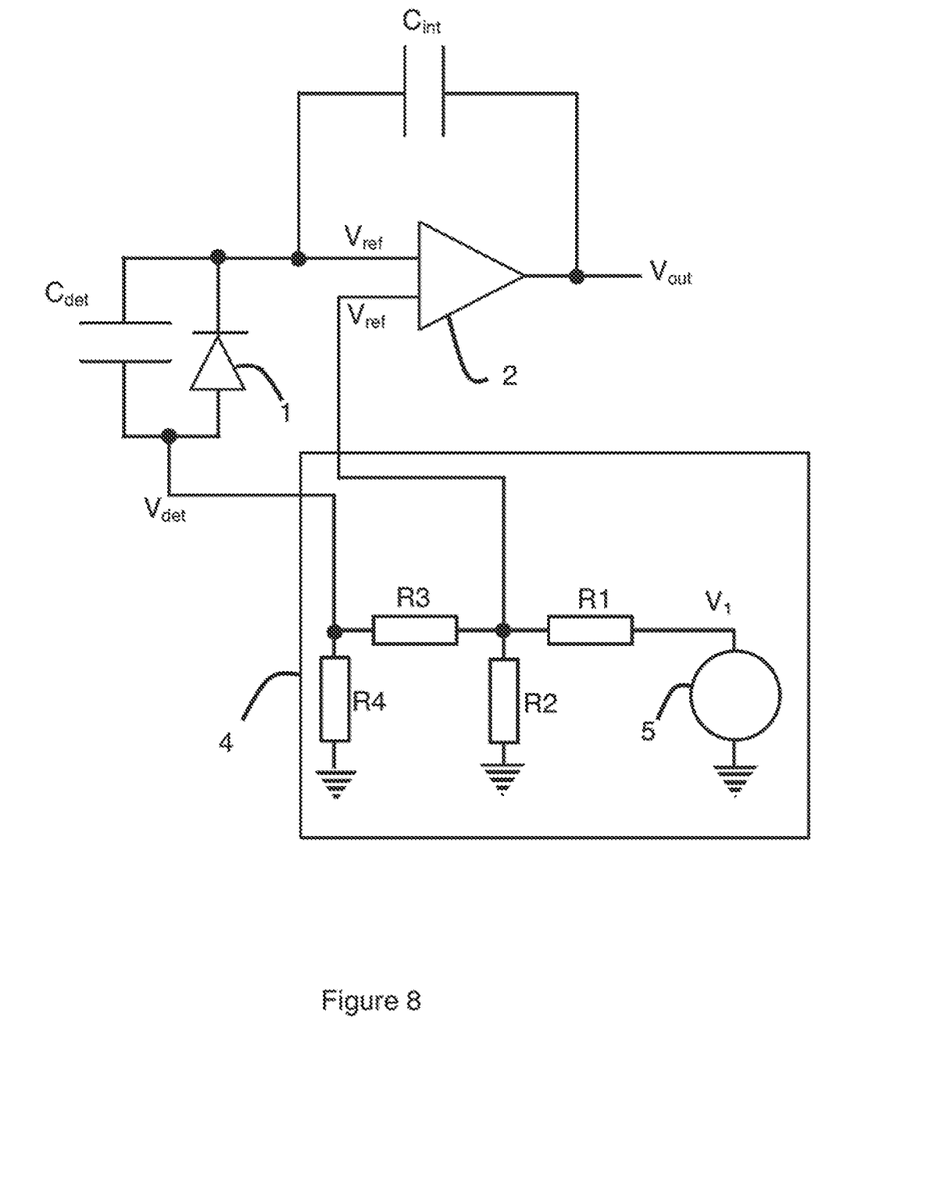
FIG. 8 represents another embodiment of a detection circuit, in schematic manner.

In an alternative embodiment illustrated in FIG. 8, the same voltage source 4 is used to deliver the voltages $V_{ref}$ and $V_{det}$, but these two voltages are not equal. For example, the voltage $V_{ref}$ is obtained from the voltage $V_{det}$ or vice versa. The two voltages are correlated to eliminate the noise component. The first voltage source and second voltage source are formed by means of an initial voltage source 5 supplying a voltage divider formed for example by a resistive bridge delivering the reference voltage $V_{ref}$ and the detector voltage $V_{det}$ different from reference voltage $V_{ref}$.

In the embodiment illustrated in FIG. 8, the voltage $V_{ref}$ is obtained from the voltage $V_{det}$ by means of a resistive bridge. An initial voltage source 5 is used to deliver the voltage $V_1$. The voltage $V_1$ is applied to the input of the resistive bridge which delivers the voltages $V_{ref}$ and $V_{det}$.

For example purposes, resistors R1 and R2 are connected in series between voltage $V_1$ and ground and voltage $V_{ref}$ is delivered by the terminal common to resistors R1 and R2.

Resistors R3 and R4 are series-connected and they are together connected in parallel with resistor R2. The voltage $V_{det}$ is delivered by the terminal common to resistors R3 and R4. Depending on the values of resistors R1, R2, R3 and R4, it is possible to define the voltages $V_{ref}$ and $V_{det}$ with respect to the voltage $V_1$.

For example purposes, the reference voltage $V_{ref}$ can be equal to 1.5V. The photodetector voltage $V_{det}$ can be offset from the reference voltage $V_{ref}$ by about 200 mV.

For a conventional voltage source, the noise level is comprised between 50 and 100 µV.

For detection of a weak signal, the integration capacitor $C_{int}$ can have a capacitance of about 50 fF. Under standard implementation conditions, the capacitance of integration capacitor $C_{det}$ is about 900 fF.

For such a detection device, a clear-cut improvement of the signal-to-noise ratio was observed using correlated voltage sources $V_{ref}$ and $V_{det}$.

Correlation of the voltage sources is advantageous in cooled detection devices, for example in detection devices having an operating temperature of less than −50° C., as these devices are generally used to detect weak fluxes. It is possible to use photodetectors made on a cadmium mercury telluride substrate, but other materials can also be envisaged.

In cooled detection devices, the photodetectors are made in a first substrate made from a first semiconductor material and the readout circuits are made in a second substrate made from a second semiconductor material different from the first semiconductor material.

The invention claimed is:

1. A detection device, comprising:
    a photodetector configured to transform an electromagnetic signal into a representative electric signal;
    an amplifier having a first input terminal connected to a first terminal of the photodetector;
    an integration capacitor connected to an output terminal of the amplifier and to the first input terminal of the amplifier;
    a first voltage source configured to deliver a reference voltage to a second input terminal of the amplifier; and
    a second voltage source configured to deliver a detector voltage to a second terminal of the photodetector, the second voltage source being correlated with the first voltage source so as to correlate noise components,
    wherein the first voltage source is different from the second voltage source so as to reverse bias the photodetector.

2. The detection device according to claim 1, wherein the amplifier is unbalanced so that a voltage on the first input terminal of the amplifier is offset from a voltage on the second input terminal of the amplifier by a voltage difference at least equal to 20 mV.

3. The detection device according to claim 2, wherein the voltage difference is between 50 and 100 mV.

4. The detection device according to claim 1, wherein the amplifier comprises a current mirror provided with first and second shunt-connected branches, and the first branch presents different electric performances from the second branch.

5. The detection device according to claim 4, wherein the first branch of the current mirror comprises several additional transistors connected in parallel with a main transistor, and the additional transistors and the main transistor have a control electrode connected to a same signal source.

6. The detection device according to claim 5, wherein the first branch of the current mirror comprises several connecting switches, and each connecting switch is associated with one of the several additional transistors to enable or to disable flow of a current from each associated additional transistor.

7. The detection device according to claim 1, wherein the first and second input terminals are respectively connected to control electrodes of first and second transistors, and the first and second transistors present different electric performances.

8. The detection device according to claim 1, wherein the first and second input terminals are respectively connected to control electrodes of first and second transistors, several additional transistors are connected in parallel to the first transistor, and the additional transistors receive a same signal as the first transistor on their control electrodes.

9. The detection device according to claim 8, further comprising:
    several connecting switches, each connecting switch associated with one of the several additional transistors to enable or to disable flow of a current from each associated additional transistor.

10. The detection device according to claim 1, wherein the first voltage source and the second voltage source are formed by means of an initial voltage source supplying a voltage divider delivering the reference voltage and the detector voltage different from the reference voltage.

* * * * *